United States Patent
Li et al.

(10) Patent No.: US 9,921,625 B1
(45) Date of Patent: Mar. 20, 2018

(54) CHASSIS STRUCTURE CAPABLE OF SENSING TEMPERATURE OF MEDIA STORAGE DEVICE

(71) Applicant: AIC INC., Taoyuan (TW)

(72) Inventors: Yun-Lan Li, Taoyuan (TW); Chin-Yen Chen, Taoyuan (TW); Fu-An Jhang, Taoyuan (TW); Wei-Shih Wu, Taoyuan (TW)

(73) Assignee: AIC INC., Taoyuan (TW)

( * ) Notice: Subject to any disclaimer, the term of this patent is extended or adjusted under 35 U.S.C. 154(b) by 8 days.

(21) Appl. No.: 15/271,230

(22) Filed: Sep. 21, 2016

(51) Int. Cl.
*G06F 1/16* (2006.01)
*G06F 1/20* (2006.01)
*H05K 7/20* (2006.01)
*G11B 33/14* (2006.01)
*H01L 23/34* (2006.01)
*G06F 1/18* (2006.01)

(52) U.S. Cl.
CPC .............. *G06F 1/206* (2013.01); *G06F 1/187* (2013.01); *G11B 33/1406* (2013.01); *H01L 23/34* (2013.01); *H05K 7/20836* (2013.01)

(58) Field of Classification Search
CPC ......... H01L 23/34; G06F 1/206; G06F 1/187; G11B 33/1406; H05K 7/20836
See application file for complete search history.

(56) References Cited

U.S. PATENT DOCUMENTS

| | | | | |
|---|---|---|---|---|
| 5,149,200 A | * | 9/1992 | Shiokawa | G01K 1/18 338/22 R |
| 2007/0253157 A1 | * | 11/2007 | Atkins | G06F 1/184 361/679.33 |

* cited by examiner

*Primary Examiner* — James Wu
(74) *Attorney, Agent, or Firm* — Chun-Ming Shih; HDLS IPR Services (57) ABSTRACT

A chassis structure capable of sensing temperature of a media storage device includes a tray. The tray includes a body, an accommodating space formed in the body, a connector disposed on the body, and a temperature sensor juxtaposed with the connector. The media storage device is electrically coupled to the connector and contacts the temperature sensor. A working temperature is measured by a temperature sensor directly attached to an outer housing of the media storage device, thereby avoiding influences such as air flow and undesired heat conduction of the chassis structure.

12 Claims, 7 Drawing Sheets

CHASSIS STRUCTURE CAPABLE OF SENSING TEMPERATURE OF MEDIA STORAGE DEVICE

TECHNICAL FIELD

The present invention relates to a chassis structure and, in particular, to a chassis structure capable of sensing temperature of a media storage device, wherein a working temperature can be measured by a temperature sensor directly attached to an outer housing of the media storage device, thereby avoiding influences such as air flow and undesired heat conduction of the chassis structure.

BACKGROUND

With development of technology and the Internet, servers or other equipment having large scale integrated circuits are provided with high integration density. A central processing unit (CPU) or a disk array in the server has increased processing speed, leading to greater heat accumulation in the server chassis. If the accumulated heat cannot be expelled out from the server chassis, temperature of elements or components in a system will increase continuously to cause malfunction. Even worse, the elements or components may be damaged. In order to ensure the server to operate normally, a heat dissipation fan is utilized to generate air flow and to thereby achieve heat exchange, so as to quickly expel the heat out from the server chassis. However, the key of efficient heat dissipation is to control operation of the heat dissipation fan.

In order to improve heat dissipation of the server chassis, besides having a temperature sensor in a heat source, the temperature sensor is also disposed in a proper position in the server chassis for measuring a temperature variation or difference between the heat source and the server, so that a rotation speed of the heat dissipation fan can be properly controlled, and heat dissipation efficiency of the server chassis is improved.

However, the temperature sensor in the server tends to be affected by air flow, heat conduction, or other factors, leading to an inaccurate temperature measurement. In other words, the temperature measurement is influenced by ambient temperature variations. Therefore, it is the aim of the present invention to accurately measure the temperature of the server chassis to thereby effectively control the heat dissipation efficiency.

SUMMARY

It is an object of the present invention to provide a chassis structure capable of sensing temperature of a media storage device, wherein a working temperature can be measured by a temperature sensor directly attached to an outer housing of the media storage device, thereby avoiding influences such as air flow and undesired heat conduction of the chassis structure.

Accordingly, the present invention provides a chassis structure capable of sensing temperature of a media storage device. The chassis structure comprises a tray. The tray includes a body, an accommodating space formed in the body, a connector disposed on the body, and a temperature sensor juxtaposed with the connector, wherein the media storage device is electrically coupled to the connector and is in contact with the temperature sensor.

According to one embodiment of the present invention, a fixed base is disposed on the body, and the temperature sensor is disposed on the fixed base.

According to one embodiment of the present invention, the body includes a fastening holder disposed in the accommodating space, the fixed base is disposed on the fastening holder and is arranged over the connector, and the connector is disposed below the fastening holder.

According to one embodiment of the present invention, the chassis structure further comprises a buffer block disposed on the body, and the temperature sensor is attached onto a surface of the buffer block.

According to one embodiment of the present invention, the chassis structure further comprises a hard pad attached onto the surface of the buffer block.

According to one embodiment of the present invention, the hard pad is arranged side by side with the temperature sensor.

According to one embodiment of the present invention, the temperature sensor has a height greater than a height of the hard pad, and a first level difference is formed between the hard pad and the temperature sensor.

According to one embodiment of the present invention, the hard pad has rigidity greater than rigidity of the temperature sensor.

According to one embodiment of the present invention, the fixed base includes a horizontal section connected to the tray and includes a vertical section vertically connected to the horizontal section, and the temperature sensor is disposed on the vertical section.

According to one embodiment of the present invention, a resilient member is disposed on the body, and the temperature sensor is disposed on the resilient member.

According to one embodiment of the present invention, the resilient member further includes a fixed portion fixed to the body and a flexible arm extending from the fixed portion.

According to one embodiment of the present invention, the resilient member further includes a sliding portion, the fixed portion and the sliding portion are disposed at two ends of the flexible arm respectively, the sliding portion further includes a groove, a guiding pillar is protrudingly disposed in the body, and the groove moves along the guiding pillar.

According to one embodiment of the present invention, the resilient member further includes at least one block plate perpendicularly connected to the flexible arm.

According to one embodiment of the present invention, the sliding portion is a hook portion, and the hook portion is bent toward the fixed portion.

According to one embodiment of the present invention, the temperature sensor has a height greater than a height of the block plate, and a second level difference is formed between the block plate and the temperature sensor.

In order to prevent the temperature sensor from being excessively pressed and damaged by the media storage device, and to ensure an accurate temperature measurement, the present invention utilizes a buffer block for providing a buffering and restoring force, so that the temperature sensor can keep in contact with the outer housing of the media storage device. Moreover, by utilizing the hard pad arranged side by side with the temperature sensor, the temperature sensor is prevented from being damaged when it is pressed.

According to another preferable embodiment, a resilient member is disposed on the fixed base. The resilient member with rigidity resiliently rebounds to contact the media storage device, and thereby the temperature sensor keeps in contact with the outer housing of the media storage device for an accurate temperature measurement. As a result, the chassis structure has a low cost, simple structure which allows a central processing unit (CPU) or other suitable control devices to obtain accurate temperature data and further control a rotation speed of a heat dissipation fan or other heat dissipation devices, thereby enhancing heat dissipation efficiency for the server.

BRIEF DESCRIPTION OF THE DRAWINGS

The disclosure will become more fully understood from the detailed description and the drawings given herein below for illustration only, and thus does not limit the disclosure, wherein.

DETAILED DESCRIPTION

Detailed descriptions and technical contents of the present invention are illustrated below in conjunction with the accompany drawings. However, it is to be understood that the descriptions and the accompany drawings disclosed herein are merely illustrative and exemplary and not intended to limit the scope of the present invention.

Referring to FIGS. 1 to 4, the present invention provides a chassis structure 100 capable of sensing temperature of a media storage device 10. The chassis structure 100 comprises a tray 110 and a temperature sensor 200. As shown in drawings, the chassis structure 100 of the present invention is preferably used in a server cabinet (not illustrated). Further, the media storage device 10 can be, but not limited to, various hard disk drives (HDD).

The tray 110 includes a body 112, an accommodating space 120 formed in the body 112, a fastening holder 130 disposed in the accommodating space 120, a connector 140 assembled to the fastening holder 130, and a fixed base 150 arranged side by side with the connector 140. In other words, the fastening holder 130 and the fixed base 150 are disposed in the accommodating space 120 of the body 112.

Figure 1:
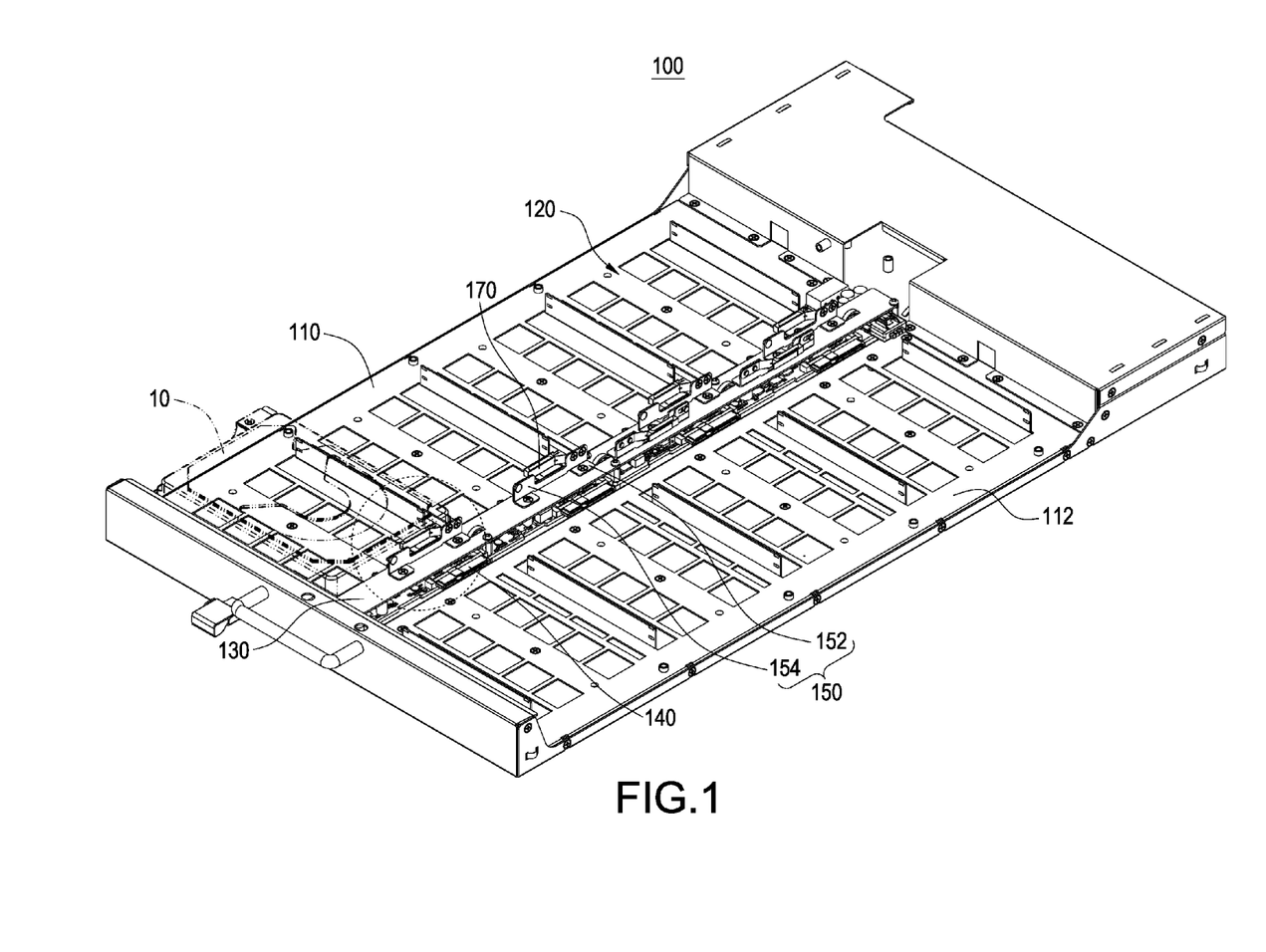
FIG. 1 is a perspective view illustrating a chassis structure of the present invention.
Figure 2:
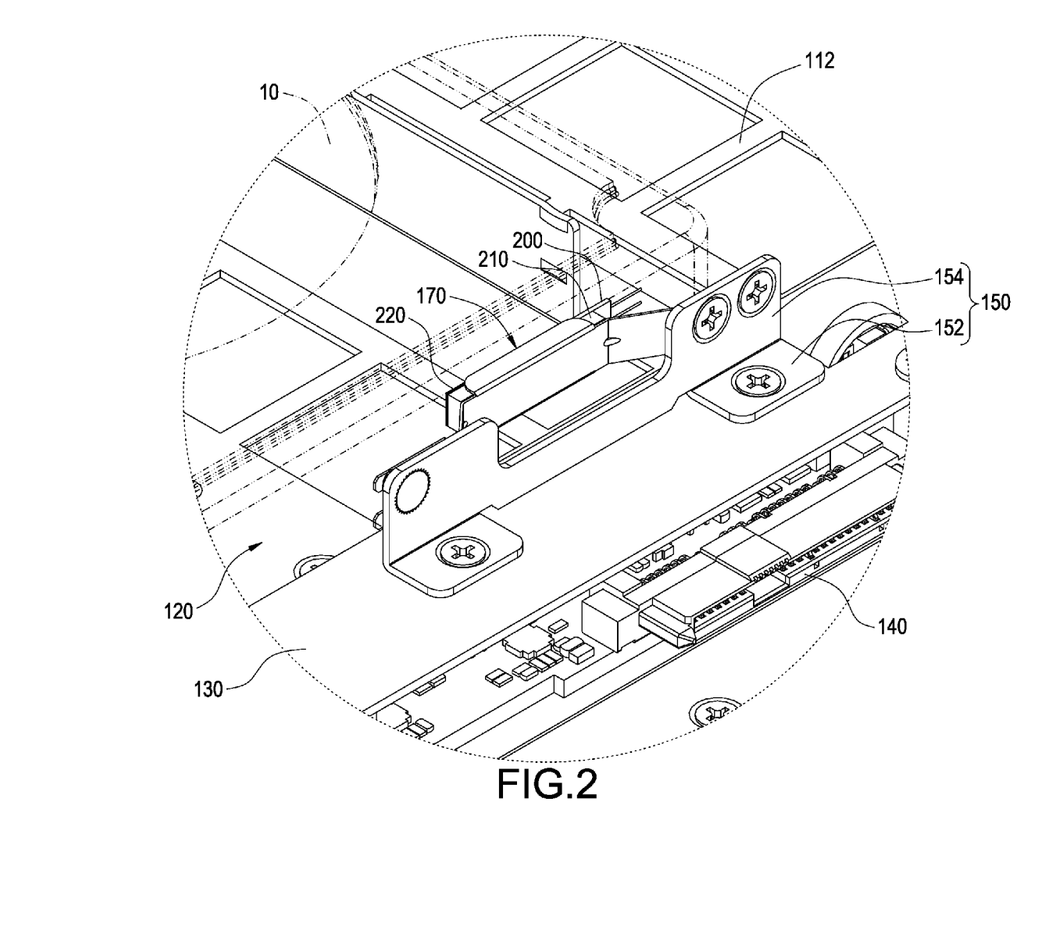
FIG. 2 is an enlarged view of FIG. 1.
Figure 4:
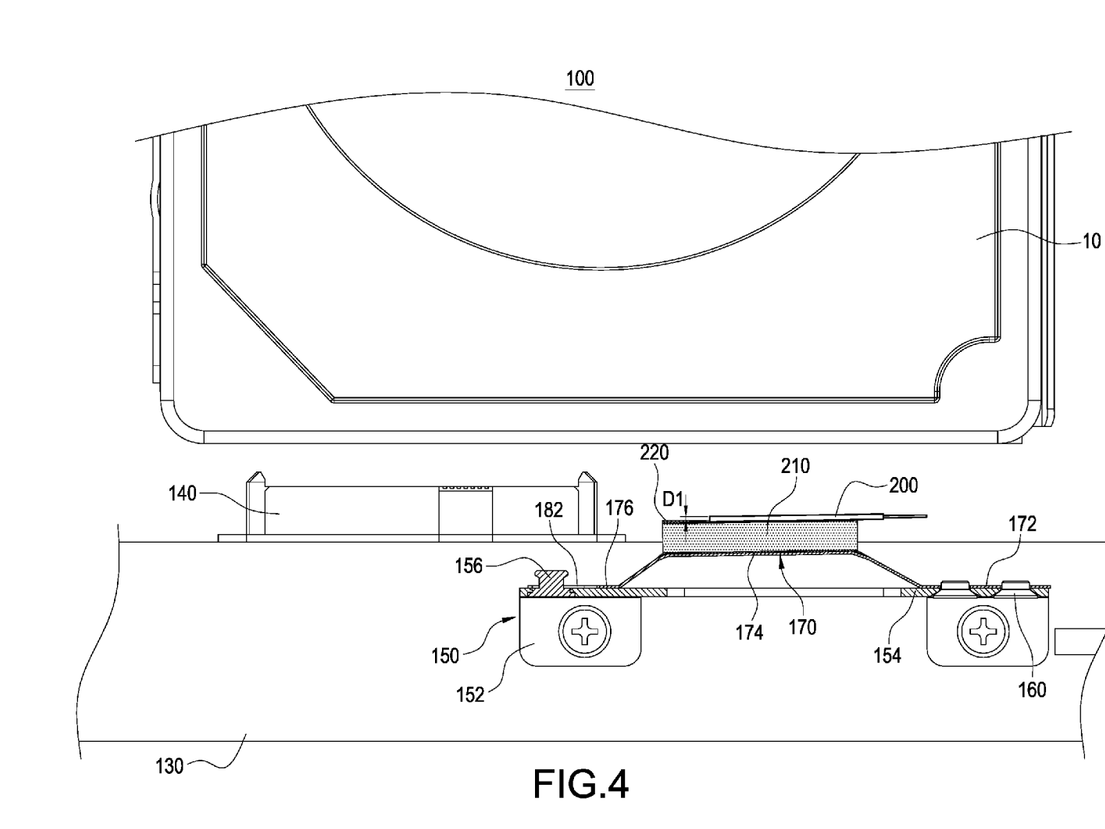
FIG. 4 is a schematic view of the present invention, illustrating that a media storage device is to be disposed on a fastening holder.

Referring to FIGS. 2 and 4, the fixed base 150 is assembled onto the fastening holder 130, and the connector 140 is disposed below the fastening holder 130, wherein the fixed base 150 is arranged over the connector 140. The fixed base 150 and the connector 140 are arranged juxtaposed with each other on the fastening holder 130. The fastening holder 130 is fixed in the middle of the body 112. A plurality of the media storage devices 10 are inserted and connected to the connectors 140 of the fixed bases 150 in a direction parallel to the body 112.

The temperature sensor 200 is disposed on the fixed base 150. The media storage device 10 is electrically coupled to the connector 140 and can contact the temperature sensor 200 for a temperature measurement of an outer housing of the media storage device 10. Each of the media storage devices 10 is electrically coupled to the corresponding connector 140 and the corresponding temperature sensor 200. The temperature sensor 200 and the connector 140 can also be directly disposed on any side wall of the body 112.

Since improper or excessive stress will cause damage to the temperature sensor 200, in order to prevent damage to the temperature sensor 200 resulting from being pressed when the media storage device 10 is inserted and connected to the connector 140, the embodiment of FIG. 4 includes a buffer block 210 disposed on the fixed base 150 and includes a hard pad 220 attached onto a surface of the buffer block 210. The hard pad 220 is preferably arranged side by side with the temperature sensor 200. The temperature sensor 200 has a height greater than a height of the hard pad 220, and a first level difference D1 is formed between the hard pad 220 and the temperature sensor 200.

According to the present embodiment, the buffer block 210 preferably consists of rubber, silicone, or other suitable heat and electrical insulating material; however, the present invention is not limited in this regard. The hard pad 220 can consist of hard plastic, glass or other suitable material, and the present invention is not limited in this regard.

Figure 6:
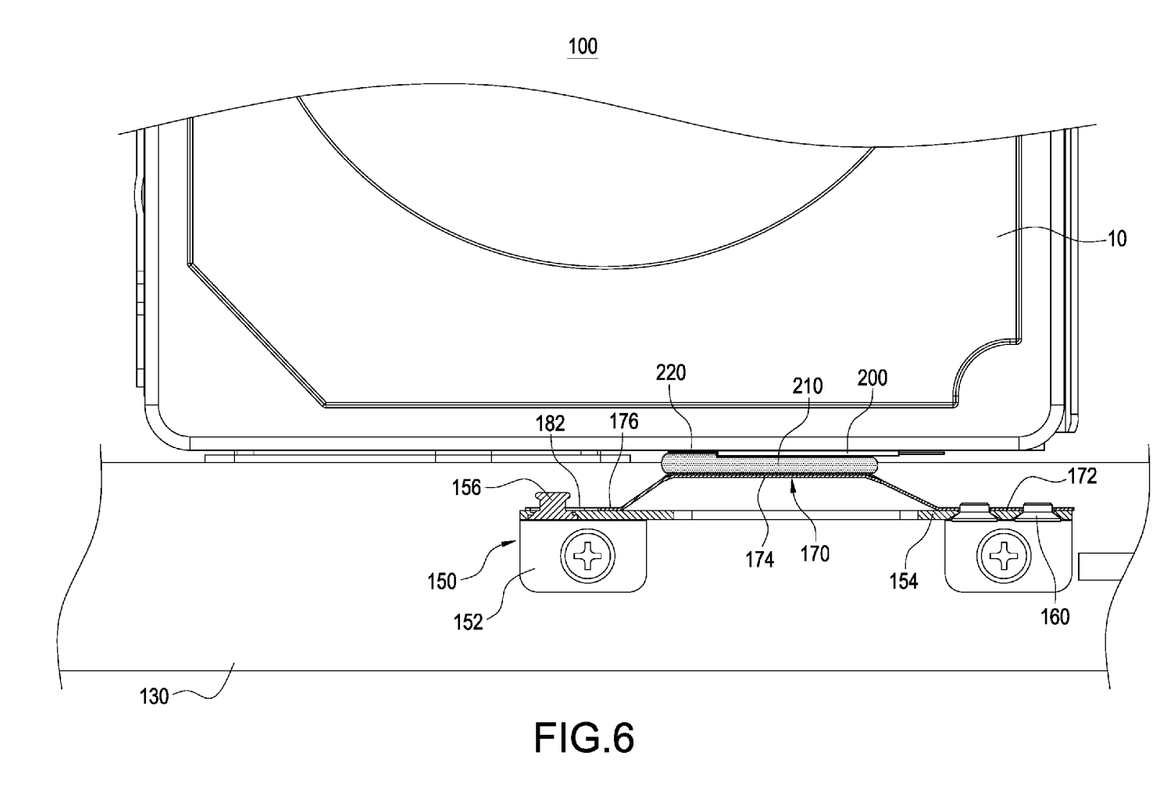
FIG. 6 is a schematic view of the present invention, illustrating the media storage device is disposed on the fastening holder.

Referring to FIG. 6, the hard pad 220 has rigidity greater than rigidity of the temperature sensor 200. Therefore, even if the media storage device 10 excessively presses the temperature sensor 200, it causes no damage to the temperature sensor 200. In other words, protected by the hard pad 220, the temperature sensor 200 is not excessively pressed by the media storage device 10.

Moreover, the fixed base 150 includes a horizontal section 152 connected to the body 112, a vertical section 154 vertically connected to the horizontal section 152, and a resilient member 170 disposed on the vertical section 154, wherein the horizontal section 152 is fixed to the fastening holder 130, and the temperature sensor 200 is disposed on the resilient member 170.

Figure 3:
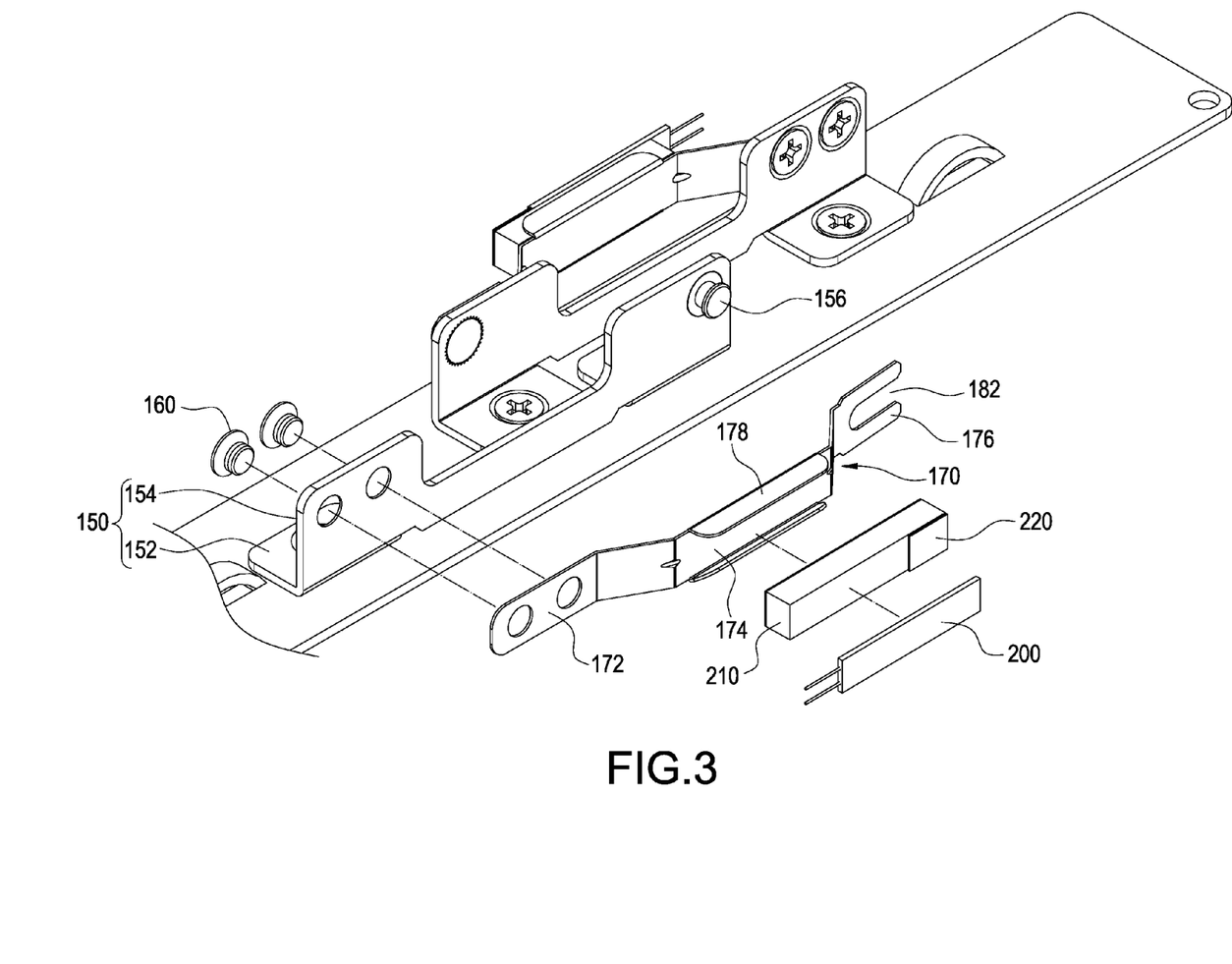
FIG. 3 is an exploded view illustrating a fixed base and a temperature sensor.

Referring to FIGS. 3, 4, and 6, the resilient member 170 made of metal further includes a fixed portion 172, a flexible arm 174 and a sliding portion 176. The fixed portion 172 and the sliding portion 176 are disposed at two ends of the flexible arm 174, respectively. The fixed portion 172 is preferably threadedly fastened onto the vertical section 154 by fastening elements 160 like screws. The sliding portion 176 is movable with respect to the vertical section 154. The flexible arm 174 protrudes in a direction away from the vertical section 154, so that the flexible arm 174 can move back and forth with respect to the fixed base 150.

According to the present embodiment, the temperature sensor 200 is preferably disposed on the buffer block 210 and is arranged over the resilient member 170, so that the temperature sensor 200 can be protected properly and can keep in contact with the media storage device 10. However, in different embodiments, the temperature sensor 200 can be disposed on the buffer block 210 or on the resilient member 170; configuration may vary as required.

Figure 7:
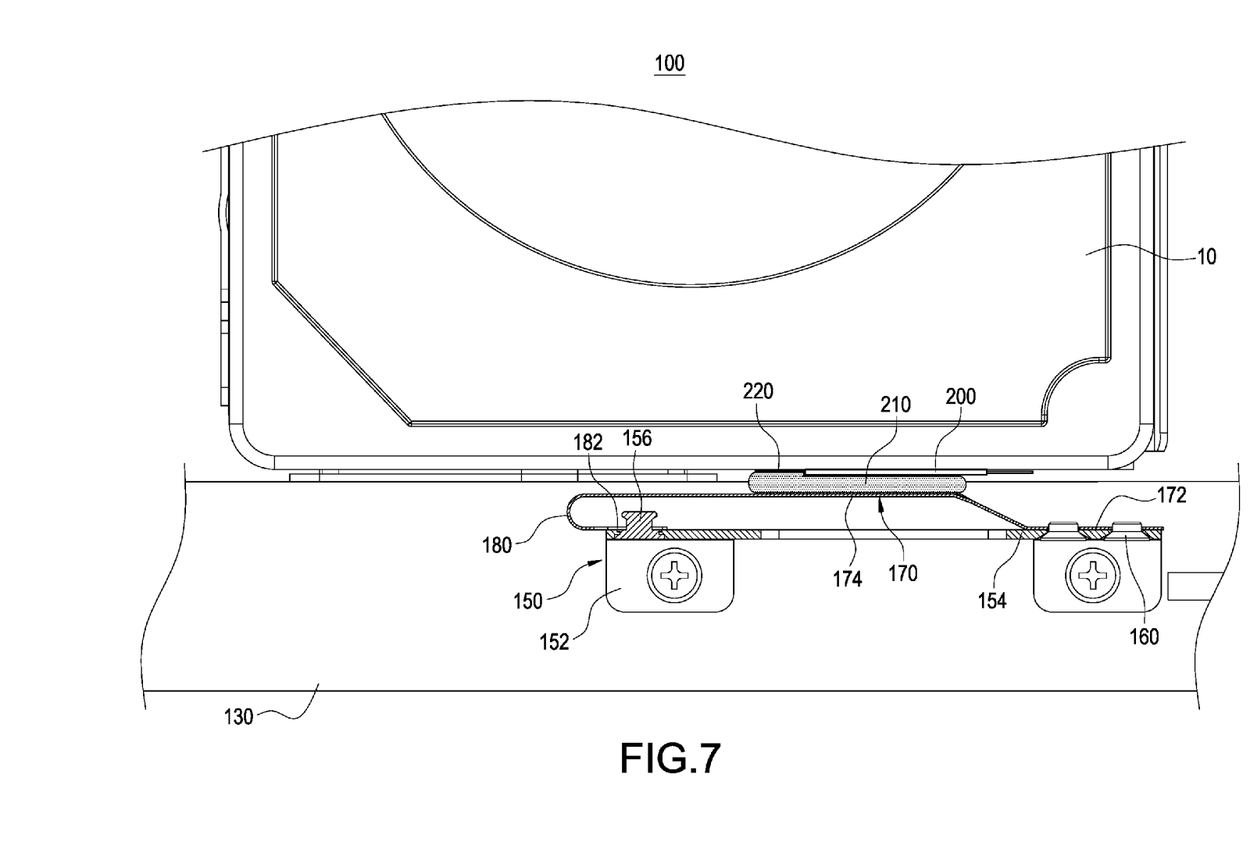
FIG. 7 is another schematic view illustrating the resilient member according to still another embodiment of the present invention.

The sliding portion 176 includes a groove 182, a guiding pillar 156 is protrudingly disposed on the vertical section 154, and the groove 182 of the sliding portion 176 moves back and forth along the guiding pillar 156, so that the resilient member 170 can move more stably and smoothly. However, in the embodiment of FIG. 7, the sliding portion 176 can be a hook portion 180, and the hook portion 180 is bent toward the fixed portion 172, thereby increasing flexibility of the resilient member 170.

Figure 5:
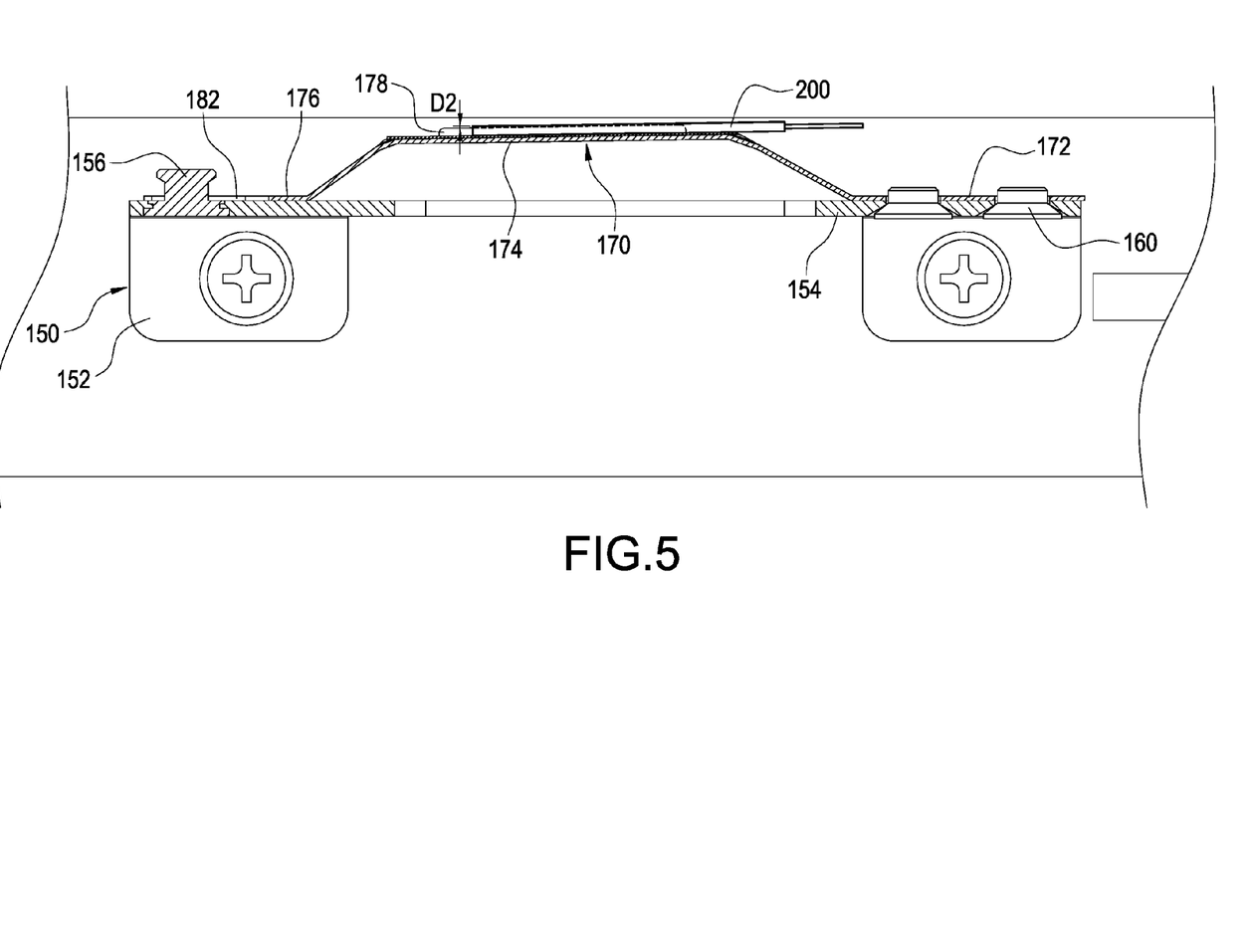
FIG. 5 is a schematic view illustrating a resilient member of the fixed base according to another embodiment of the present invention.

Please refer to FIG. 5, illustrating the resilient member according to another embodiment of the present invention. The resilient member 170 further includes at least one block plate 178 perpendicularly connected to the flexible arm 174. The temperature sensor 200 is directly attached onto the flexible arm 174 and is in contact against one side of the block plate 178. The temperature sensor 200 preferably has a height greater than a height of the block plate 178, and a second level difference D2 is formed between the block plate 178 and the temperature sensor 200. As shown in FIG. 5, when the media storage device 10 presses the temperature sensor 200, the block plate 178 can protect the temperature sensor 200, and in addition to that, the resilient member 170 serves as a buffer for protecting the temperature sensor 200 from being damaged when the resilient member 170 is pressed to move toward the fixed base 150. After the media storage device 10 is connected to the connector 140, the resilient member 170 with rigidity resiliently rebounds to contact the media storage device 10, so the temperature sensor 200 keeps in contact with the outer housing of the media storage device 10 for an accurate temperature measurement.

The chassis structure 100 of the present invention is constructed to allow the temperature sensor 200 to be directly attached to the outer housing of the media storage device 10 for an accurate temperature measurement, thus avoiding undesired influences such as air flow and heat conduction. Accordingly, a central processing unit (CPU, not illustrated) or other suitable control device can obtain the accurate temperature data to further control a rotation speed of a heat dissipation fan (not illustrated) or other heat sink devices, thereby efficiently enhancing heat dissipation efficiency of a server (not illustrated).

It is to be understood that the above descriptions are merely the preferable embodiment of the present invention and are not intended to limit the scope of the present invention. Equivalent changes and modifications made in the spirit of the present invention are regarded as falling within the scope of the present invention.

What is claimed is:

1. A chassis structure capable of sensing temperature of a media storage device, comprising:
a tray, the tray including a body, an accommodating space formed in the body, a connector disposed on the body, and a temperature sensor juxtaposed with the connector, wherein the media storage device is electrically coupled to the connector and is in contact with the temperature sensor,
wherein a resilient member is disposed on the body, the temperature sensor is disposed on the resilient member, and the resilient member further includes a fixed portion fixed to the body and a flexible arm extending from the fixed portion;
wherein the resilient member further includes a sliding portion, the fixed portion and the sliding portion are disposed at two ends of the flexible arm respectively, the sliding portion includes a groove, a guiding pillar is protrudingly disposed on the body, and the groove moves along the guiding pillar.

2. The chassis structure capable of sensing temperature of the media storage device of claim 1, wherein a fixed base is disposed on the body, and the temperature sensor is disposed on the fixed base.

3. The chassis structure capable of sensing temperature of the media storage device of claim 2, wherein the body includes a fastening holder disposed in the accommodating space, the fixed base is disposed on the fastening holder and is arranged over the connector, and the connector is disposed below the fastening holder.

4. The chassis structure capable of sensing temperature of the media storage device of claim 2, wherein the fixed base includes a horizontal section connected to the body and includes a vertical section vertically connected to the horizontal section, and the temperature sensor is disposed on the vertical section.

5. The chassis structure capable of sensing temperature of the media storage device of claim 1, further comprising a buffer block disposed on the body, the temperature sensor being attached onto a surface of the buffer block.

6. The chassis structure capable of sensing temperature of the media storage device of claim 5, further comprising a hard pad attached onto the surface of the buffer block.

7. The chassis structure capable of sensing temperature of the media storage device of claim 6, wherein the hard pad is arranged side by side with the temperature sensor.

8. The chassis structure capable of sensing temperature of the media storage device of claim 6, wherein the temperature sensor has a height greater than a height of the hard pad, and a first level difference is formed between the hard pad and the temperature sensor.

9. The chassis structure capable of sensing temperature of the media storage device of claim 8, wherein the resilient member further includes at least one block plate perpendicularly connected to the flexible arm.

10. The chassis structure capable of sensing temperature of the media storage device of claim 9, wherein the temperature sensor has a height greater than a height of the block plate, and a second level difference is formed between the block plate and the temperature sensor.

11. The chassis structure capable of sensing temperature of the media storage device of claim 6, wherein the hard pad has rigidity greater than rigidity of the temperature sensor.

12. The chassis structure capable of sensing temperature of the media storage device of claim 1, wherein the sliding portion is a hook portion, and the hook portion is bent toward the fixed portion.

* * * * *